(12) United States Patent
Kim et al.

(10) Patent No.: US 8,367,444 B2
(45) Date of Patent: Feb. 5, 2013

(54) DISPLAY SUBSTRATE AND METHOD OF MANUFACTURING THE SAME

(75) Inventors: Young-Min Kim, Yongin-si (KR); Bo-Sung Kim, Seoul (KR); Seon-Pil Jang, Seoul (KR); Seung-Hwan Cho, Suwon-si (KR); Kang-Moon Jo, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 133 days.

(21) Appl. No.: 12/902,761

(22) Filed: Oct. 12, 2010

(65) Prior Publication Data

US 2011/0254011 A1    Oct. 20, 2011

(30) Foreign Application Priority Data

Apr. 19, 2010   (KR) .................. 10-2010-0035789

(51) Int. Cl.
*H01L 21/02*   (2006.01)

(52) U.S. Cl. .......... 438/34; 438/152; 438/155; 438/158; 257/E21.409; 257/E21.586; 257/E27.131; 257/E29.289; 257/E33.053

(58) Field of Classification Search ............... 438/30, 438/34, 152–158; 257/E21.159, E21.409, 257/E21.586, E21.27, E21.111, E21.132, 257/E29.117, E29.289, E33.004, E33.053
See application file for complete search history.

(56) References Cited

U.S. PATENT DOCUMENTS

| | | | | |
|---|---|---|---|---|
| 5,828,433 A * | 10/1998 | Shin | | 349/147 |
| 7,759,738 B2 * | 7/2010 | Kim et al. | | 257/350 |
| 7,978,276 B2 * | 7/2011 | Kim et al. | | 349/43 |
| 8,058,114 B2 * | 11/2011 | Kim et al. | | 438/152 |
| 8,174,657 B2 * | 5/2012 | Lim | | 349/141 |
| 2003/0151711 A1 * | 8/2003 | Yuh et al. | | 349/129 |
| 2005/0242401 A1 * | 11/2005 | Cho et al. | | 257/368 |
| 2009/0020758 A1 * | 1/2009 | Lee et al. | | 257/59 |
| 2009/0267087 A1 * | 10/2009 | Yang et al. | | 257/88 |
| 2011/0114955 A1 * | 5/2011 | Chun et al. | | 257/59 |
| 2011/0140117 A1 * | 6/2011 | Lee et al. | | 257/59 |
| 2011/0157681 A1 * | 6/2011 | Kwon et al. | | 359/296 |
| 2011/0171793 A1 * | 7/2011 | Jung et al. | | 438/158 |
| 2011/0187686 A1 * | 8/2011 | Kim | | 345/206 |
| 2011/0248274 A1 * | 10/2011 | Kim et al. | | 257/59 |

* cited by examiner

*Primary Examiner* — Michael Lebentritt
(74) *Attorney, Agent, or Firm* — H.C. Park & Associates, PLC

(57) ABSTRACT

A display substrate includes a gate line, a gate insulation layer, a data line, a switching element, a protection insulation layer, a gate pad portion and a data pad portion. The gate insulation layer is disposed on the gate line. The switching element is connected to the gate line and the data line. The protection insulation layer is disposed on the switching element. The gate pad portion includes a first gate pad electrode which makes contact with an end portion of the gate line through a first hole formed through the gate insulation layer, and a second gate pad electrode which makes contact with the first gate pad electrode through a second hole formed through the protection insulation layer. The data pad portion includes a data pad electrode which makes contact with an end portion of the data line through a third hole formed through the protection insulation layer.

11 Claims, 17 Drawing Sheets

100

DISPLAY SUBSTRATE AND METHOD OF MANUFACTURING THE SAME

CROSS REFERENCE TO RELATED APPLICATION

This application claims priority from and the benefit of Korean Patent Application No. 2010-35789, filed on Apr. 19, 2010, which is hereby incorporated by reference for all purposes as if fully set forth herein.

BACKGROUND OF THE INVENTION

1. Field of the Invention

Exemplary embodiments of the present invention relate to a display substrate and a method of manufacturing the display substrate. More particularly, exemplary embodiments of the present invention relate to a display substrate that may be manufactured by a simplified manufacturing process and may have an enhanced reliability, and a method of manufacturing the display substrate.

2. Discussion of the Background

Generally, a liquid crystal display ("LCD") device includes a display substrate (i.e., a thin-film transistor ("TFT") substrate), an opposition substrate (or a counter substrate), and a liquid crystal layer disposed between the display substrate and the opposition substrate. The display substrate includes a gate line and a data line crossing the gate line. In addition, the display substrate includes a switching element connected to the gate line and the source line, and a pixel electrode connected to the switching element. The switching element includes a gate electrode, a semiconductor pattern, a source electrode and a drain electrode. The gate electrode is connected to the gate line, and the semiconductor pattern is overlapped with and insulated from the gate electrode. The source electrode is connected to the data line, electrically isolated from the gate electrode, and electrically connected to the semiconductor pattern. The drain electrode is spaced apart from the source electrode to be electrically connected to the semiconductor pattern.

In order to manufacture a display substrate, a plurality of masks is used. For example, a first mask for forming the gate line and the gate electrode, a second mask for forming the semiconductor pattern, a third mask for forming the data line, the source electrode and the drain electrode, a fourth mask for forming a contact hole exposing the drain electrode and a fifth mask for forming the pixel electrode are used to manufacture the display substrate.

Recently, in order to reduce time and costs associated with manufacturing, a manufacturing process reducing a number of masks has been developed to simplify a masking process. For example, a four-masking process has been developed in which a semiconductor pattern, a data line, a source electrode and a drain electrode are formed using only one mask. However, in the four-masking process, the semiconductor pattern is formed below the data line. The semiconductor pattern formed below the data line may generate display defects such as a waterfall.

When the number of the masks is increased, element characteristics and driving reliability of the display substrate may be enhanced. However, manufacturing costs and manufacturing time of the display substrate are increased.

SUMMARY OF THE INVENTION

Exemplary embodiments of the present invention provide a display substrate that may be manufactured by a simplified manufacturing process and may have an enhanced reliability.

Exemplary embodiments of the present invention also provide a method of manufacturing the above-mentioned display substrate.

Additional features of the invention will be set forth in the description which follows, and in part will be apparent from the description, or may be learned by practice of the invention.

The present invention discloses a display substrate including a gate line, a gate insulation layer, a data line, a switching element, a protection insulation layer, a gate pad portion and a data pad portion. The gate line is extended in a first direction on a substrate. The gate insulation layer is disposed on the gate line. The data line is extended in a second direction crossing the first direction. The switching element is connected to the gate line and the data line. The protection insulation layer is disposed on the switching element. The gate pad portion includes a first gate pad electrode which makes contact with an end portion of the gate line through a first hole formed through the gate insulation layer, and a second gate pad electrode which makes contact with the first gate pad electrode through a second hole formed through the protection insulation layer. The data pad portion includes a data pad electrode which makes contact with an end portion of the data line through a third hole formed through the protection insulation layer.

The present invention also discloses a method of manufacturing a display substrate. In the method, a gate metal pattern is formed, which includes a gate line and a gate electrode and a sacrificial metal pattern formed on the gate metal pattern by patterning a gate metal layer and a first sacrificial metal layer formed on a substrate. A gate insulation layer is formed, which has a first hole formed therethrough exposing an end portion of the gate line by using the first sacrificial metal pattern formed on an end portion of the gate line. A semiconductor pattern is formed on the gate insulation layer corresponding to an area where the gate electrode is formed. A data metal pattern is formed on the semiconductor pattern. The data metal pattern includes a source electrode connected to a data line, a drain electrode spaced apart from the source electrode and a first gate metal pad electrode which makes contact with an end portion of the gate line through the first hole. A protection insulation layer is formed, which has a second hole formed therethrough exposing the first pad electrode and a third hole formed therethrough exposing an end portion of the data line. A second gate pad electrode, a data electrode and a pixel electrode are formed. The second gate pad electrode makes contact with the first gate pad electrode through the second hole. The data pad electrode makes contact with an end portion of the data line through the third hole. The pixel electrode is electrically connected to the drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
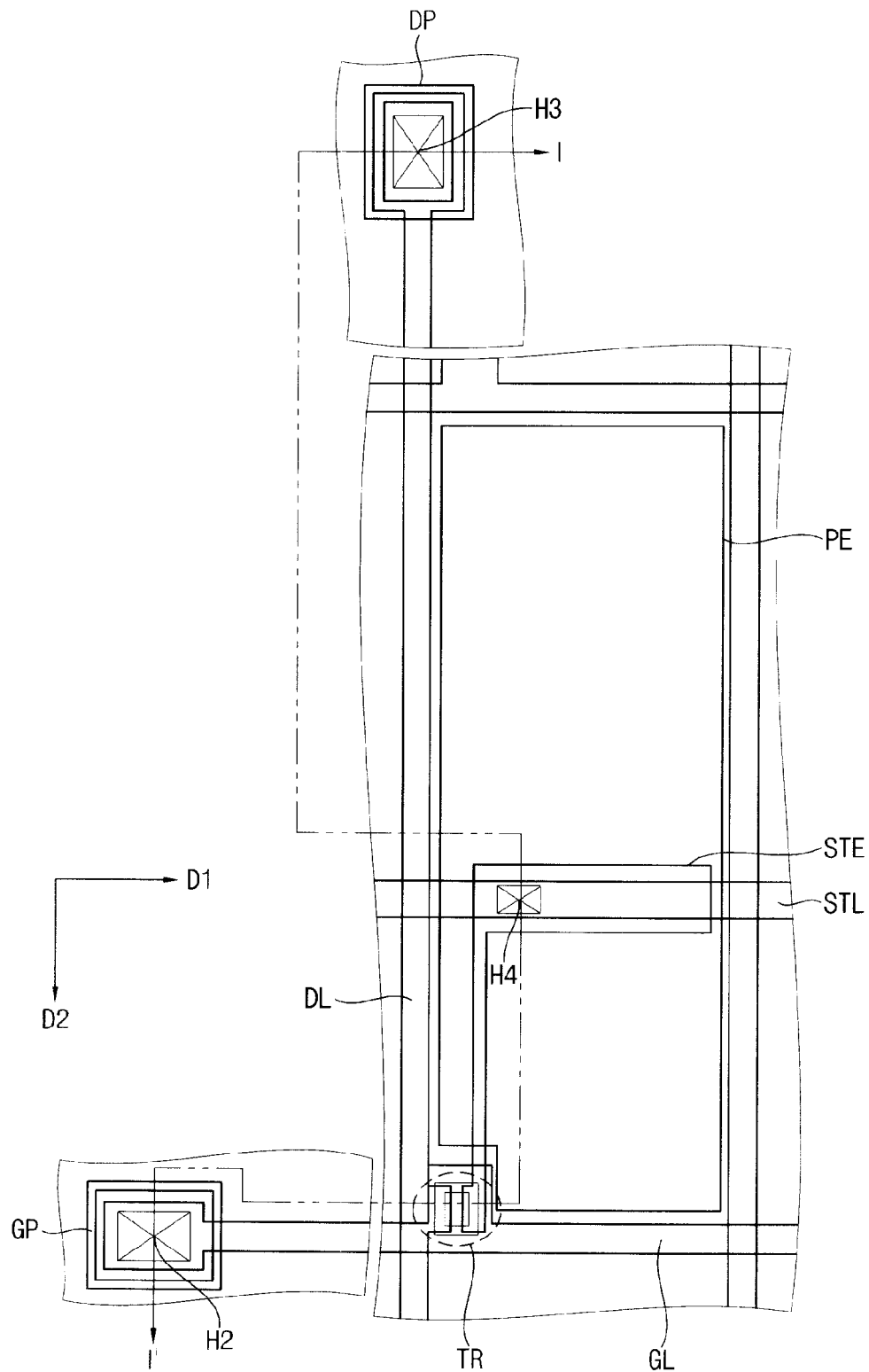
FIG. 1 is a plan view showing a display substrate according to an exemplary embodiment of the present invention.

The present invention is described more fully hereinafter with reference to the accompanying drawings, in which exemplary embodiments of the present invention are shown. The present invention may, however, be embodied in many different forms and should not be construed as limited to the exemplary embodiments set forth herein. Rather, these exemplary embodiments are provided so that this disclosure is thorough, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected to or coupled to the other element or layer, or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the invention are described herein with reference to cross-sectional illustrations that are schematic illustrations of idealized exemplary embodiments (and intermediate structures) of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be explained in detail with reference to the accompanying drawings.

Figure 2:
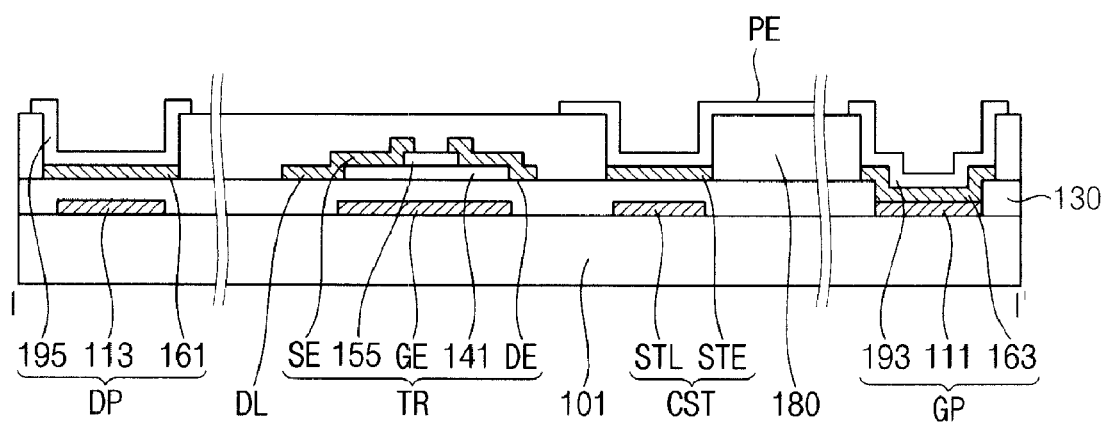
FIG. 2 is a cross-sectional view taken along line I-I' of FIG. 1.

FIG. 1 is a plan view showing a display substrate according to an exemplary embodiment of the present invention. FIG. 2 is a cross-sectional view taken along line I-I' of FIG. 1.

Referring to FIG. 1 and FIG. 2, the display substrate 100 includes a gate line GL, a gate pad portion GP, a data line DL, a data pad portion DP, a switching element TR, a storage line STL and a pixel electrode PE.

The gate line GL is disposed on a substrate 101 to be extended in a first direction D1. The gate lines GL are arranged in a second direction D2 crossing the first direction D1.

The gate pad portion GP is formed at an end portion of the gate line GL to receive an electric signal which will be applied to the gate line GL. For example, the gate pad portion GP includes an end portion 111 of the gate line GL, a first gate pad electrode 163 and a second gate pad electrode 193. The first gate pad electrode 163 makes contact with the end portion 111 through a hole formed through a gate insulation layer 130. The second gate pad electrode 193 makes contact with the first gate pad electrode 163 through a hole formed through a protection insulation layer 180.

The data line DL is disposed on the substrate 101 to be extended in the second direction D2. The data lines DL are arranged in the first direction D1.

The data pad portion DP is formed at an end portion of the data line DL to receive an electric signal which will be applied to the data line DL. For example, the data pad portion DP includes an end portion 161 of the data line DL and a data pad electrode 195 electrically connected to the end portion 161 through a hole formed through the protection insulation layer 180. The data pad portion DP may further include a dummy pattern 113 to compensate for a stepped difference between the gate pad portion GP and the data pad portion DP. The dummy pattern 113 is electrically floated.

The switching element TR is electrically connected to the gate line GL, the data line DL and the pixel electrode PE to include a gate electrode GE, a semiconductor pattern 141, an etching prevention pattern 155, a source electrode SE and a drain electrode DE. The gate electrode GE is connected to the gate line GL, and the semiconductor pattern 141 is overlapped with the gate electrode GE. The semiconductor pattern 141 may include an oxide semiconductor material. The etching prevention pattern 155 is disposed on the semiconductor pattern 141 corresponding to a channel area of the switching element TR. The source electrode SE is overlapped with a first end portion of the semiconductor pattern 141, and the drain electrode DE is overlapped with a second end portion of the semiconductor pattern 141 to be spaced apart from the source electrode SE by interposing the etching prevention pattern 155 therebetween.

The storage line STL is disposed on the substrate 101. The storage line STL is extended in the first direction D1 to be parallel with the gate line GL. The storage lines STL are arranged in the second direction D2. The storage line STL is electrically connected to a storage capacitor CST. For example, the storage capacitor CST includes a storage line STL, a gate insulation layer 130, which covers the storage line STL, and a storage electrode STE, which overlaps with the storage line STL and is disposed on the gate insulation layer 130. The storage electrode STE is electrically connected to the pixel electrode PE through a hole formed through the protection insulation layer 180. The storage line STL receives a common voltage, and the storage electrode STL is electrically connected to the pixel electrode PE to receive a pixel voltage applied to the pixel electrode PE.

The pixel electrode PE is electrically connected to the switching element TR. For example, the pixel electrode PE is electrically connected to the storage electrode STE extended from the drain electrode DE, so that the pixel electrode PE may be electrically connected to the switching element TR.

According to the present exemplary embodiment, the data line DL makes contact directly with the gate insulation layer 130. That is, the semiconductor pattern 141 of the switching element TR makes contact with the source and drain electrodes SE and DE of the switching element TR; however, the semiconductor pattern 141 is not disposed below the data line DL. Thus, the semiconductor pattern is not formed between the data line DL and the gate insulation layer 130, so that display defects such as a waterfall may be prevented.

Figure 3:
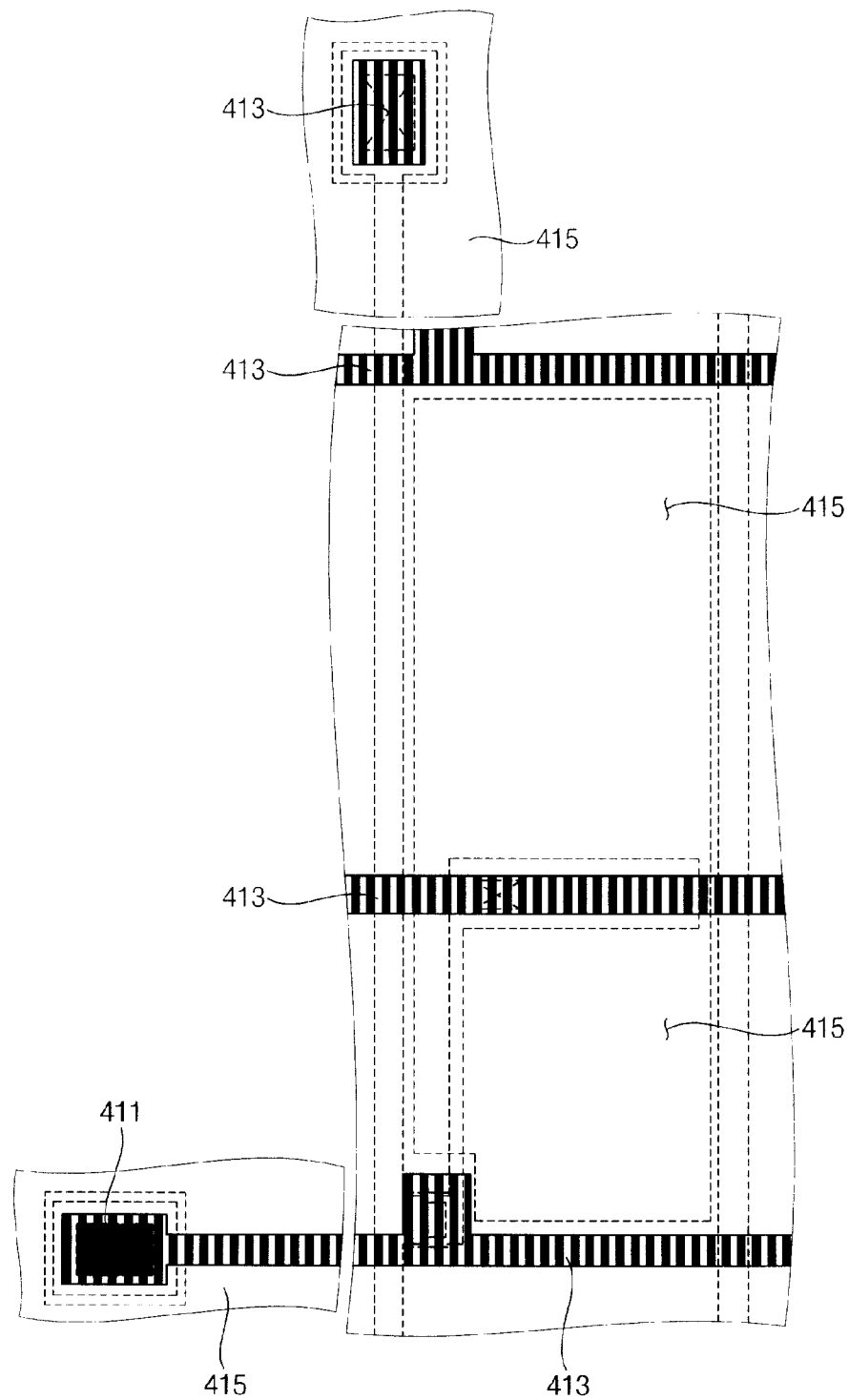
FIG. 3 is a plan view showing a first mask for manufacturing the display substrate of FIG. 1.

FIG. 3 is a plan view showing a first mask for manufacturing the display substrate of FIG. 1. FIG. 4A, FIG. 4B, FIG. 4C, FIG. 4D and FIG. 4E are cross-sectional views explaining a method of manufacturing the display substrate of FIG. 1 by using the first mask of FIG. 3.

Referring to FIG. 1 and FIG. 3, the first mask 410 is a mask for patterning a positive photoresist to include a light-blocking portion 411, a slit portion 413 and a light-transmitting portion 415. The light-blocking portion 411 is an area in which light is blocked, the slit portion 413 is an area in which light is diffracted, and the light-transmitting portion 415 is an area in which light is transmitted. Thus, the light-blocking portion 411 and the slit portion 413 are formed in correspondence with an area where a pattern is formed on the substrate 101, and the light-transmitting portion 415 is disposed in correspondence with an area where a pattern is not formed on the substrate 101.

For example, the slit portion 413 is formed on an area on which the gate line GL, the gate electrode GE and the storage line STL are formed. Moreover, when the data pad portion DP includes the dummy pattern 113, the slit portion 413 may be further formed on an area where the dummy pattern 113 is formed. The light-blocking portion 411 is disposed on an area through which a hole exposing an end portion of the gate line GL is formed, and the light-transmitting portion 415 is disposed on an area in which the pattern is not formed.

Figure 4A:
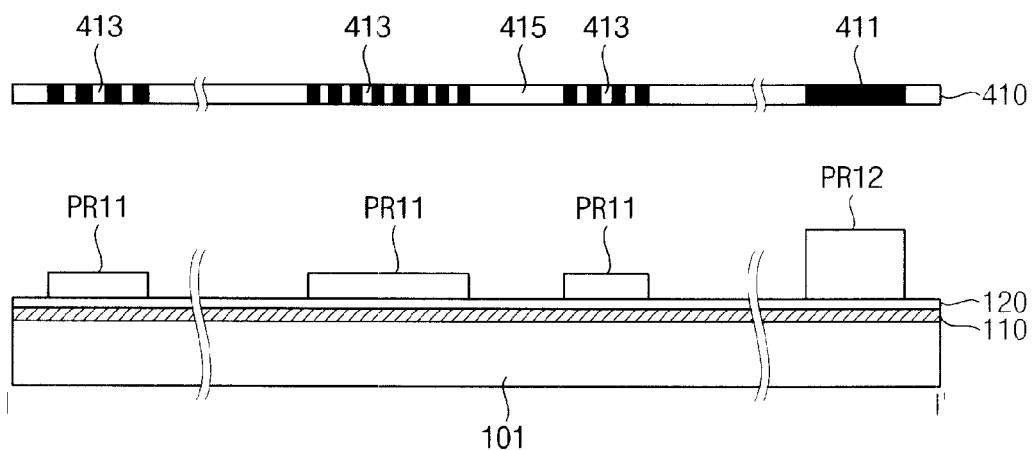
FIG. 4A, FIG. 4B, FIG. 4C, FIG. 4D and FIG. 4E are cross-sectional views explaining a method of manufacturing the display substrate of FIG. 1 by using the first mask of FIG. 3.

Referring to FIG. 1 and FIG. 4A, the substrate 101 includes an optically transparent insulation material capable of transmitting light. A gate metal layer 110 and a first sacrificial metal layer 120 are formed on the substrate 101.

The gate metal layer 110 may include, for example, a metallic material such as molybdenum (Mo), titanium (Ti), copper (Cu), aluminum (Al), neodymium (Nd), etc., or a metal alloy thereof. The gate metal layer 110 may have at least a double-layered structure of metallic materials having different physical characteristics to each other. For example, the gate metal layer 110 includes a first metal layer and a second metal layer that is sequentially formed on the first metal layer. The gate metal layer 110 may be formed on the substrate 101 through a sputtering process.

The first sacrificial metal layer 120 may include a material having an etch selectivity with respect to the gate metal layer 110. The first sacrificial metal layer 120 may include, for example, a metallic material such as molybdenum (Mo), titanium (Ti), copper (Cu), aluminum (Al), indium tin oxide (ITO), indium zinc oxide (IZO), etc., or a metal alloy thereof. The first sacrificial metal layer 120 may have at least a double-layered structure of metallic materials having different physical characteristics to each other. For example, the first sacrificial metal layer 120 may have a Mo/Al/Mo structure, a Cu/Ti structure, a Mo/ITO structure, etc.

A positive photoresist material is deposited on the substrate 101 in which the first sacrificial metal layer 120 is formed to form a first photoresist layer. The first photoresist layer is patterned by using the first mask 410. The first photoresist layer includes a first photo pattern PR11 and a second photo pattern PR12 that are formed through the first mask 410. A thickness of the second photo pattern PR12 is greater than that of the first photo pattern PR11. The first photo pattern PR11 is formed on an area where the gate line GL, the gate electrode GE, the storage line STL and the dummy pattern 113 are formed, and the second photo pattern PR12 is formed on an area where an end portion 111 of the gate line GL is formed.

In this exemplary embodiment, a positive photoresist of which an exposed area is removed by a developing solution is described as an example of the first photoresist layer. Alternatively, a negative photoresist of which a non-exposed area is removed by a developing solution may be formed as an example of the first photoresist layer. When the negative photoresist material is used, a disposing area of the light-blocking portion 411 and a disposing area of the light-transmitting portion 415 may be exchanged with each other in the first mask 410.

Figure 4B:
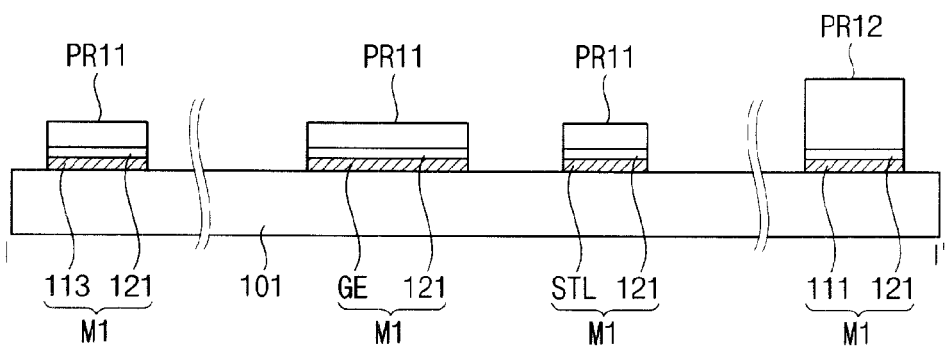

Referring to FIG. 1, FIG. 4A and FIG. 4B, the gate metal layer 110 and the first sacrificial metal layer 120 are etched using the first photo pattern PR11 and the second photo pattern PR12 as a mask to form a first metal pattern M1. The first metal pattern M1 includes a gate metal pattern in which the gate metal layer 110 is patterned and a first sacrificial metal pattern 121 in which the first sacrificial metal layer 120 is patterned to be formed on the gate metal pattern. For example, the gate metal pattern includes the gate line GL, the gate electrode GE, the storage line STL and an end portion 111 of the gate line GL.

The gate metal layer 110 and the first sacrificial metal layer 120 may be etched through a wet-etching process or a dry-etching process.

Figure 4C:
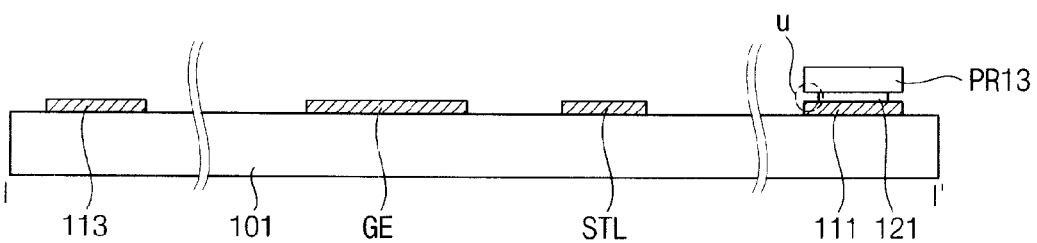

Referring to FIG. 1, FIG. 4B and FIG. 4C, the first photo pattern PR11 formed on the first metal pattern M1 is removed by using an etch back process and the second photo pattern PR12 formed on the first metal pattern M1 is partially removed by using the etch back process, so that a first remaining pattern PR13 is formed. Thus, the first sacrificial metal pattern 121, which is respectively formed on the gate line GL, the gate electrode GE, the storage line STL and the dummy pattern 113, is exposed, and the first remaining pattern PR13 is disposed on an end portion 111 of the gate line GL.

The first sacrificial metal pattern 121 formed on the gate line GL, the gate electrode GE, the storage line STL and the dummy pattern 113 is etched using the first remaining pattern PR13 as a mask. The first remaining pattern PR13 forms an undercut U in the first sacrificial metal pattern 121 formed on an end portion 111 of the gate line GL.

Figure 4D:
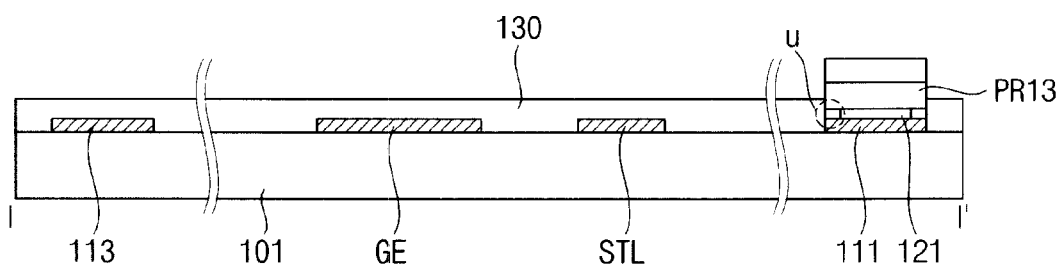

Referring to FIG. 1, FIG. 4C and FIG. 4D, the gate insulation layer 130 is formed on the substrate 101 having the undercut U formed thereon. The gate insulation layer 130 may include a soluble organic-inorganic material such as a silicon oxide (SiOx), a silicon nitride (SiNx), a silicon polymer, etc. The gate insulation layer 130 may be formed through a chemical vapor deposition ("CVD") process or a coating process, etc. Moreover, the gate insulation layer 130 may have at least a double-layered structure of insulating materials having different physical characteristics to each other. For example, the gate insulation layer 130 may have a double-layered structure in which a silicon nitride (SiNx) layer and a silicon oxide (SiOx) layer are sequentially deposited.

The gate insulation layer 130 covers the gate line GL, the gate electrode GE, the storage line STL and the dummy pattern 113, and further covers the first remaining pattern PR13.

Figure 4E:
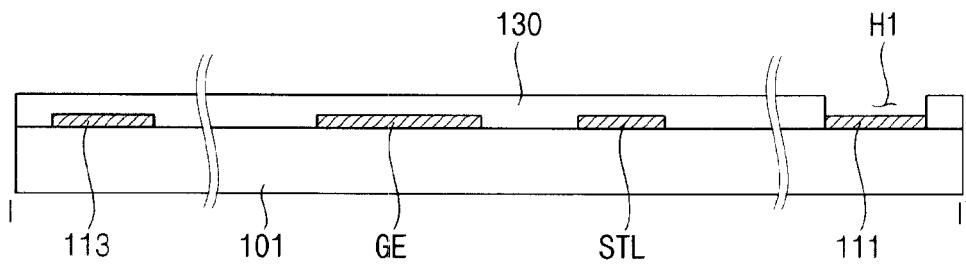

Referring to FIG. 1, FIG. 4D and FIG. 4E, in the substrate 101 on which the gate insulation layer 130 is formed, the first sacrificial metal pattern 121 formed on an end portion 111 of the gate line GL is removed by using an etching solution. The etching solution is infiltrated into a gap of the gate insulation layer 130 which is formed by the undercut U, so that the first sacrificial metal pattern 121 formed on the end portion 111 of the gate line GL is etched. Thus, the first sacrificial metal pattern 121 is removed, and the first remaining pattern PR13 formed on the first sacrificial metal pattern 121 is removed simultaneously with the removal of the first sacrificial metal pattern 121.

As a result, a first hole H1 exposing an end portion 111 of the gate line GL is formed through the gate insulation layer 130.

Figure 5:
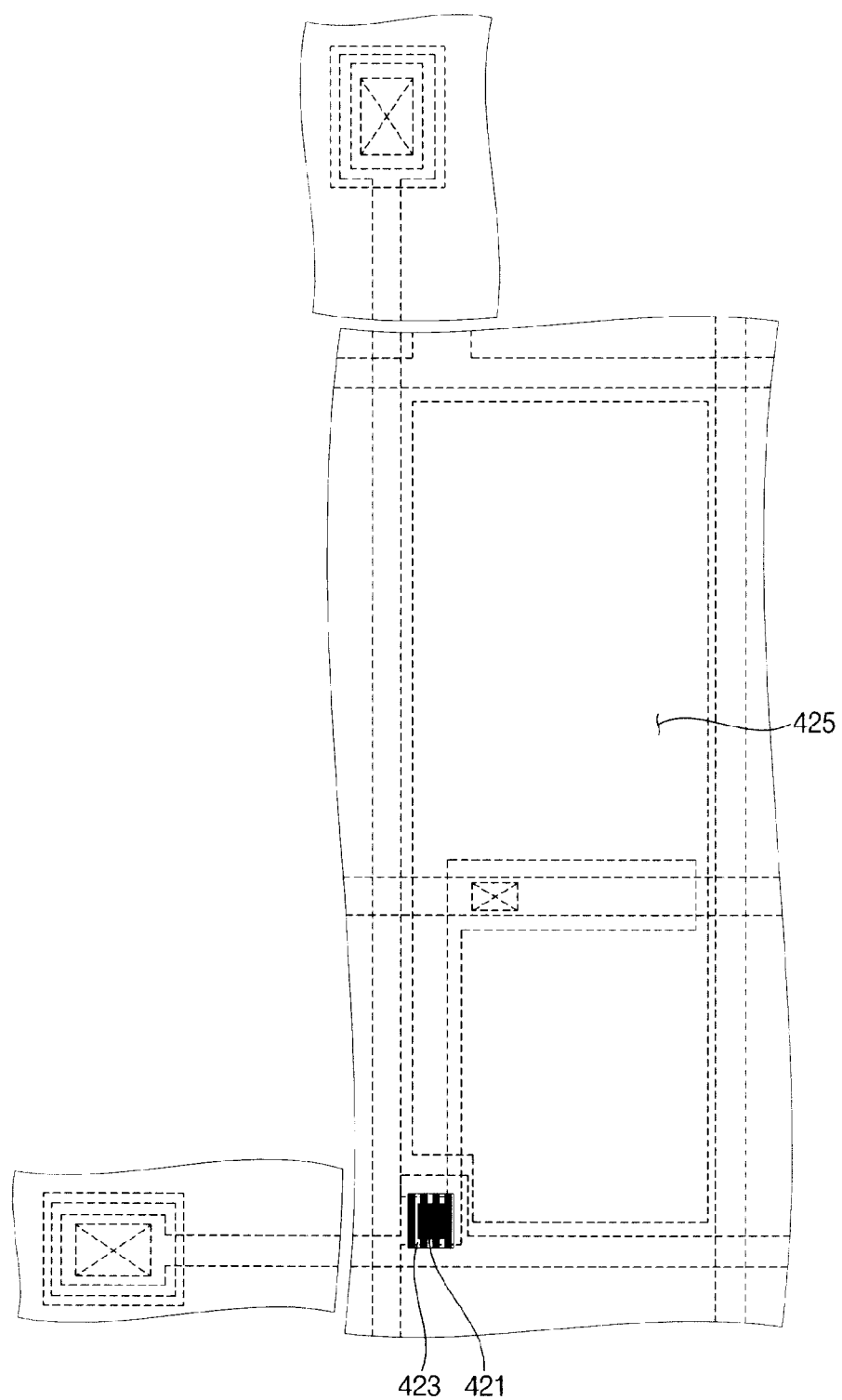
FIG. 5 is a plan view showing a second mask for manufacturing the display substrate of FIG. 1.

FIG. 5 is a plan view showing a second mask for manufacturing the display substrate of FIG. 1. FIG. 6A, FIG. 6B, FIG. 6C and FIG. 6D are cross-sectional views explaining a method of manufacturing the display substrate of FIG. 1 by using the second mask of FIG. 5.

Referring to FIG. 1 and FIG. 5, the second mask 420 is a mask for patterning a positive photoresist. The second mask 420 includes a light-blocking portion 421, a slit portion 423 and a light-transmitting portion 425. The light-blocking portion 421 is an area in which light is blocked, the slit portion 423 is an area in which light is diffracted, and the light-transmitting portion 425 is an area in which light is transmitted.

The slit portion 423 is formed on an area where the semiconductor pattern 141 is formed, the light-blocking portion 423 is disposed on an area where the etching prevention pattern 155 is formed, and the light-transmitting portion 425 is disposed on an area where the semiconductor pattern 141 and the etching prevention pattern 155 are not formed.

Figure 6A:
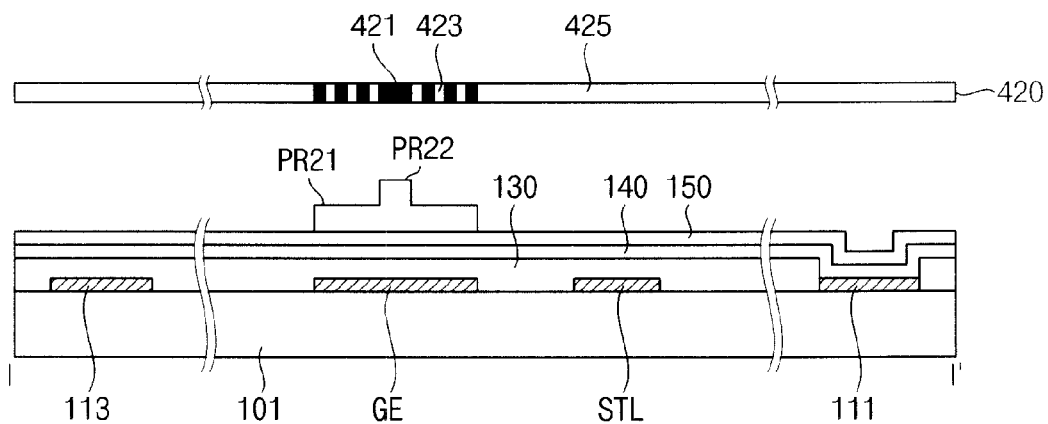
FIG. 6A, FIG. 6B, FIG. 6C and FIG. 6D are cross-sectional views explaining a method of manufacturing the display substrate of FIG. 1 by using the second mask of FIG. 5.

Referring to FIG. 1, FIG. 4E and FIG. 6A, a semiconductor layer 140 and an insulation layer 150 are formed on the gate insulation layer 130 having the first hole H1 formed therethrough.

The semiconductor layer 140 may include an oxide semiconductor material. The oxide semiconductor material may be a zinc oxide (ZnO), a gallium indium zinc oxide (GIZO), etc., which may be formed in a solution process or a vacuum process. For example, the oxide semiconductor material may include X-indium-zinc oxide (XIZO). In the present exemplary embodiment, 'X' may represent tin (Sn), gallium (Ga), aluminum (Al), beryllium (Be), magnesium (Mg), calcium (Ca), strontium (Sr), barium (Ba), radium (Ra), thallium (Tl), scandium (Sc), yttrium (Y), lanthanum (La), actinium (Ac), titanium (Ti), zirconium (Zr), hafnium (Hf), tantalum (Ta), rutherfordium (Rf), etc. An example of the XIZO may be $Ga_2O_3$—$In_2O_3$—ZnO (GIZO), $HfO_2$—$In_2O_3$—ZnO, etc. Moreover, the oxide semiconductor material may include an X-zinc-tin oxide (XZTO) or an X-indium-tin oxide (XITO). Here, 'X' may be one of the chemical elements described above. The semiconductor layer 140 may be formed through a sputtering process or a coating process.

The insulation layer 150 is an etching prevention layer which prevents the semiconductor layer 140 from being etched. The insulation layer 150 may include a soluble organic-inorganic material such as a silicon oxide (SiOx), a silicon nitride (SiNx), a silicon polymer, etc. The insulation layer 150 may be formed through a CVD process or a coating process, etc.

A positive photoresist is deposited on the substrate 101 on which the insulation layer 150 is formed to form a second photoresist layer. The second photoresist layer is patterned by using the second mask 420. A third photo pattern PR21 is formed on the second photoresist layer through the slit portion 423, and a fourth photo pattern PR22 thicker than the third photo pattern PR21 is formed on the second photoresist layer through the light-blocking portion 421. The third photo pattern PR21 is disposed on an area where the semiconductor pattern 141 is formed, and the fourth photo pattern PR22 is disposed on an area where the etching prevention pattern 155 is formed.

Figure 6B:
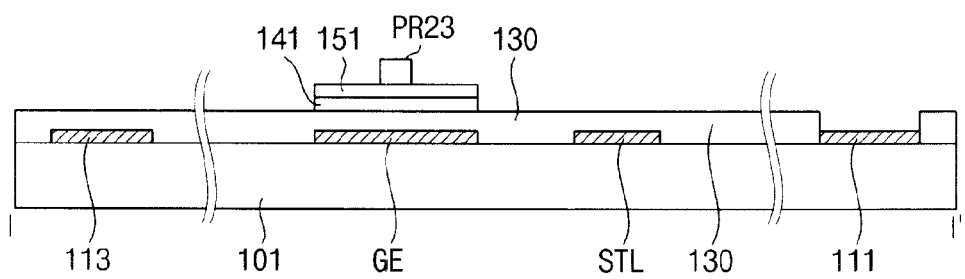

Referring to FIG. 1, FIG. 6A and FIG. 6B, the semiconductor layer 140 and the insulation layer 150 are patterned using the third photo pattern PR21 and the fourth photo pattern PR22 as a mask. The semiconductor layer 140 is patterned as the semiconductor pattern 141, and the insulation layer 150 is patterned as an insulation pattern 151 disposed on the semiconductor pattern 141.

The third photo pattern PR21 is removed and the fourth photo pattern PR22 is partially removed through an etch back process to form a second remaining pattern PR23. The second remaining pattern PR23 is disposed on an area where the etching prevention pattern 155 is formed.

Figure 6C:
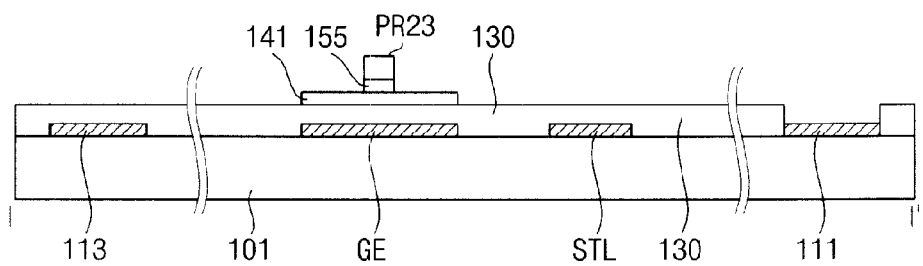
Figure 6D:
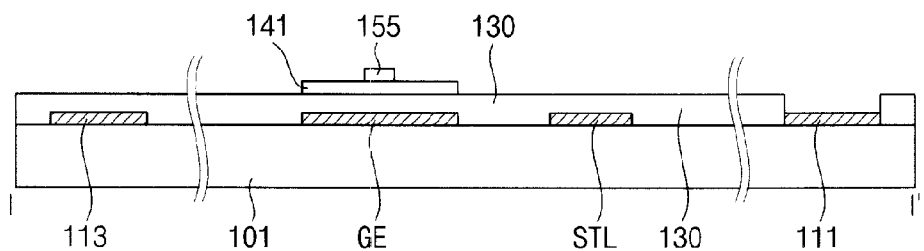

Referring to FIG. 1, FIG. 6C and FIG. 6D, the insulation pattern 151 is etched using the second remaining pattern PR23 as a mask to form the etching prevention pattern 155 on the semiconductor pattern 141. Then, the second remaining pattern PR23 is removed.

Figure 7:
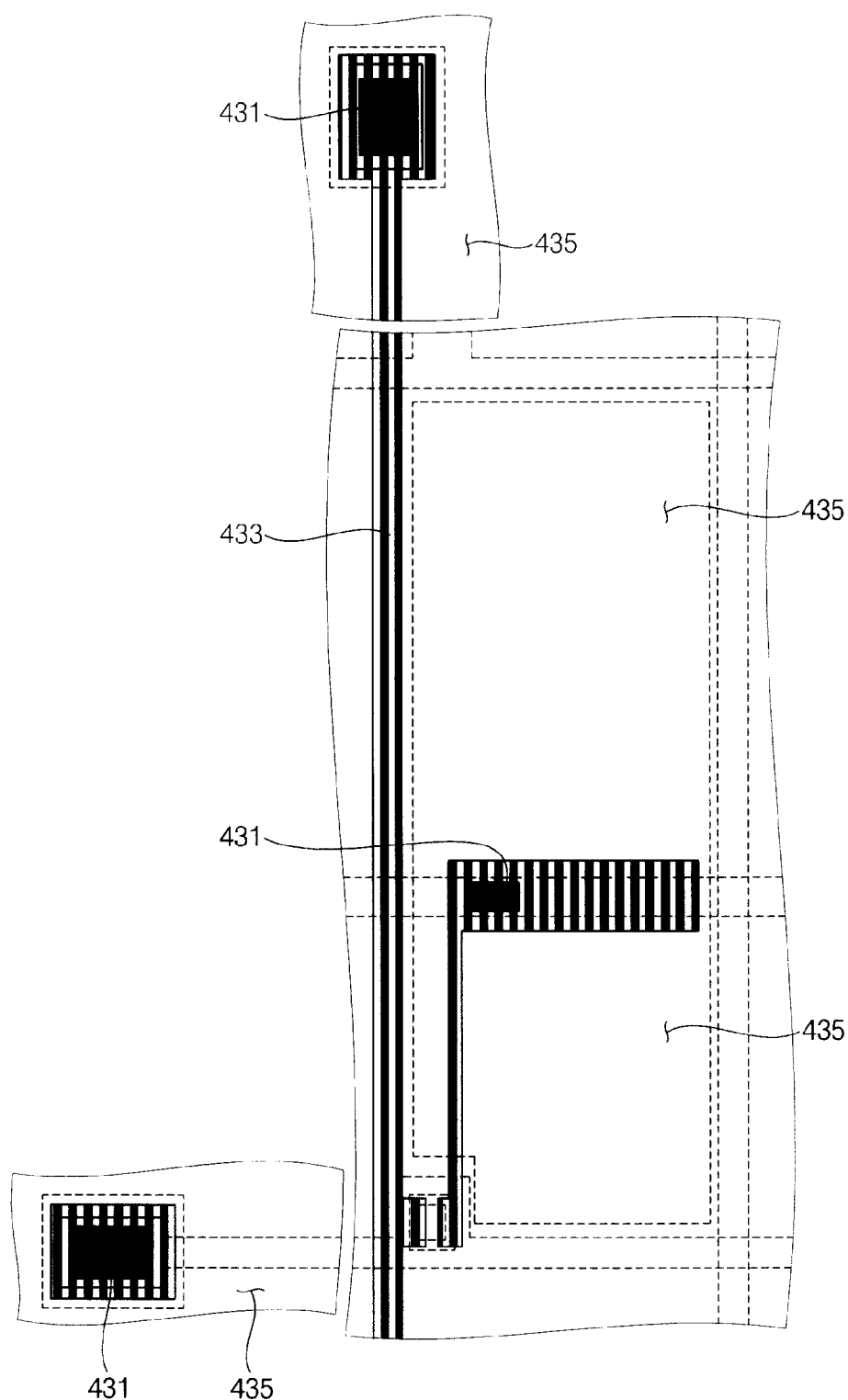
FIG. 7 is a plan view showing a third mask for manufacturing the display substrate of FIG. 1.

FIG. 7 is a plan view showing a third mask for manufacturing the display substrate of FIG. 1. FIG. 8A, FIG. 8B, FIG. 8C and FIG. 8D are cross-sectional views explaining a method of manufacturing the display substrate of FIG. 1 by using the third mask of FIG. 7.

Referring to FIG. 1 and FIG. 7, the third mask 430 is a mask for patterning a positive photoresist. The third mask 430 includes a light-blocking portion 431, a slit portion 433 and a light-transmitting portion 435. The light-blocking portion 431 is an area in which light is blocked, the slit portion 433 is an area in which light is diffracted, and the light-transmitting portion 435 is an area in which light is transmitted.

The slit portion 433 is formed on an area where the data line DL, the source electrode SE, the drain electrode DE, the storage electrode STE extended from the drain electrode DE, an end portion 161 of the data line DL and the first gate pad electrode 163 are formed. The light-blocking portion 431 is disposed in correspondence with an area where a second hole H2 exposing the first gate pad electrode 163, a third hole H3 exposing the end portion 161 of the data line DL and a fourth hole H4 exposing the storage electrode STE are formed.

Figure 8A:
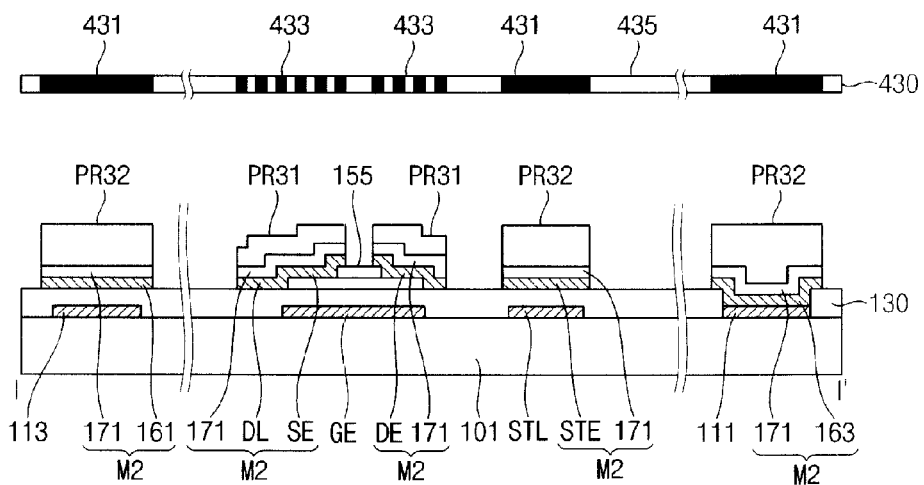
FIG. 8A, FIG. 8B, FIG. 8C and FIG. 8D are cross-sectional views explaining a method of manufacturing the display substrate of FIG. 1 by using the second mask of FIG. 7.

Referring to FIG. 7, FIG. 6D and FIG. 8A, a source metal layer and a second sacrificial metal layer are formed on the substrate 101 on which the etching prevention pattern 155 is formed.

The source metal layer may include, for example, a metallic material such as molybdenum (Mo), titanium (Ti), copper (Cu), aluminum (Al), neodymium (Nd), indium tin oxide (ITO), etc., or a metal alloy thereof. The source metal layer may have at least a double-layered structure of metallic materials having different physical characteristics to each other. For example, the source metal layer includes a first metal layer and a second metal layer that is sequentially formed on the first metal layer. The source metal layer may be formed on the substrate 101 through a sputtering process.

The second sacrificial metal layer may include a material having an etch selectivity with respect to the source metal layer. The second sacrificial metal layer may include, for example, a metallic material such as molybdenum (Mo), titanium (Ti), copper (Cu), aluminum (Al), indium tin oxide (ITO), indium zinc oxide (IZO), etc., or a metal alloy thereof. The second sacrificial metal layer may have at least a double-layered structure of metallic materials having different physical characteristics to each other. For example, the second sacrificial metal layer may have a Mo/Al/Mo structure, a Cu/Ti, Mo/ITO structure, etc.

A positive photoresist is deposited on the substrate 101 on which the second sacrificial metal layer is formed to form a third photoresist layer. The third photoresist layer is patterned by using the third mask 430. The third photoresist layer includes a fifth photo pattern PR31 and a sixth photo pattern PR32 that are formed through the third mask 430. A thickness of the sixth photo pattern PR32 is greater than that of the fifth photo pattern PR31. The fifth photo pattern PR31 is formed on an area where the data line DL, the source electrode SE, the drain electrode DE and the storage electrode STE are formed. The sixth photo pattern PR32 is formed on an area where a third hole H3 exposing an end portion 161 of the data line DL and a fourth hole H4 exposing a portion area of the storage electrode STE are formed.

The source metal layer and the second sacrificial metal layer are etched using the fifth photo pattern PR31 and the sixth photo pattern PR32 as a mask to form a second metal pattern M2. The second metal pattern M2 may include a source metal pattern by which the source metal layer is patterned and a second sacrificial metal pattern 171 by which the second sacrificial metal layer is patterned. The second metal pattern M2 includes the data line DL, the source electrode SE, the drain electrode DE and the storage electrode STE.

The source metal layer and the second sacrificial metal layer may be etched through a wet etching process or a dry etching process. Preferably, the source metal layer and the second sacrificial metal layer may be etched through a wet etching process.

Figure 8B:
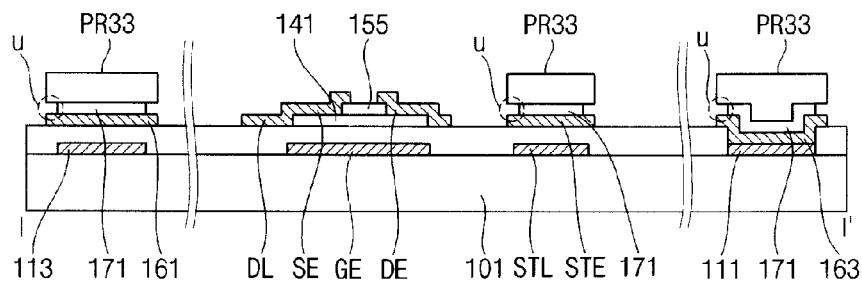

Referring to FIG. 7, FIG. 8A and FIG. 8B, the fifth photo pattern PR31 formed on the second metal pattern M2 is removed and the sixth photo pattern PR32 formed on the second metal pattern M2 is partially removed by using the etch back process, so that a third remaining pattern PR33 is formed. Thus, the second sacrificial metal pattern 171, which is respectively formed on the data line DL, the source electrode SE, the drain electrode DE and the storage electrode STE, is exposed, and the third remaining pattern PR33 is disposed on an end portion 161 of the data line DL, the first gate pad electrode 163 and a portion of the storage electrode STE.

The second sacrificial metal pattern 171 formed on the data line DL, the source electrode SE, the drain electrode DE and the storage electrode STE is etched using the third remaining pattern PR33 as a mask. The third remaining pattern PR33 forms an undercut U in the second sacrificial metal pattern 171 formed on the end portion 161 of the data line DL, the first gate pad electrode 163 and a portion of the storage electrode STE.

Figure 8C:
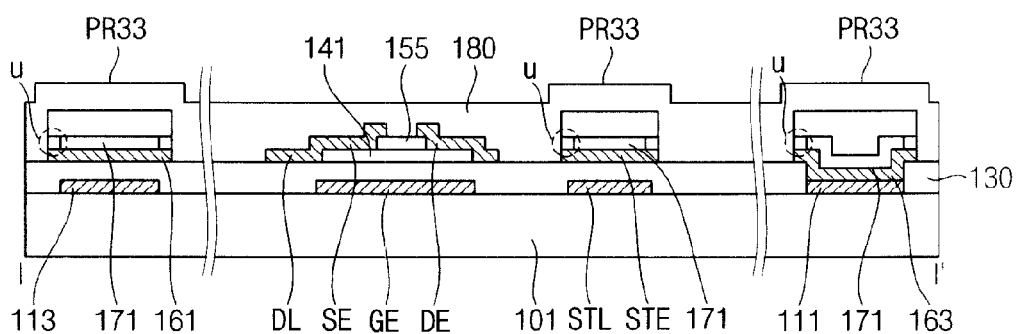

Referring to FIG. 7, FIG. 8B and FIG. 8C, the protection insulation layer 180 is formed on the substrate 101 having the undercut U formed thereon. The protection insulation layer 180 may include a soluble organic-inorganic material such as a silicon oxide (SiOx), a silicon nitride (SiNx), a silicon polymer, etc. The protection insulation layer 180 may be formed through a CVD process or a coating process, etc.

The protection insulation layer 180 covers the source metal pattern including the data line DL, the source electrode SE, the drain electrode DE and the storage electrode STE, and covers the third remaining pattern PR33.

Figure 8D:
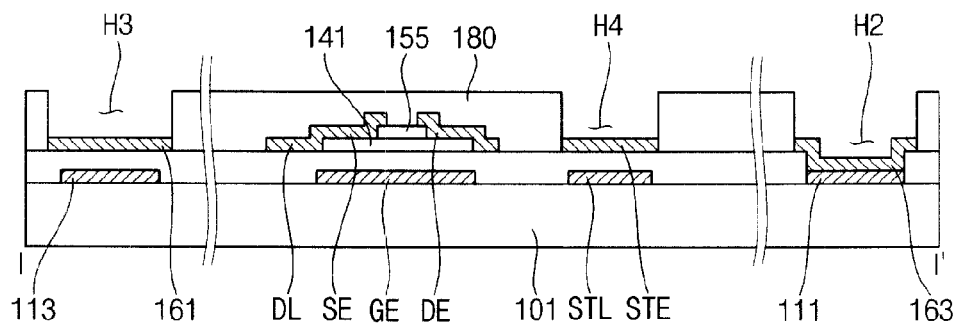

Referring to FIG. 7, FIG. 8C and FIG. 8D, in the substrate 101 on which the protection insulation layer 180 is formed, the second sacrificial metal pattern 171 formed on the end portion 161 of the data line DL, the first gate pad electrode 163 and a portion of the storage electrode STE are removed by using an etching solution. The etching solution is infiltrated into a gap of the protection insulation layer 180 which is formed by the undercut U, so that the second sacrificial metal pattern 171 formed on the end portion 161 of the data line DL, the first gate pad electrode 163 and a portion of the storage electrode STE is etched. Thus, the second sacrificial metal pattern 171 is removed, and the third remaining pattern PR33 formed on the second sacrificial metal pattern 171 is removed simultaneously with the removal of the second sacrificial metal pattern 171.

As a result, the second hole H2 exposing the first gate pad electrode 163, the third hole H3 exposing the end portion 161 of the data line DL and the fourth hole H4 exposing a portion area of the storage electrode STE are formed through the protection insulation layer 180. The second hole H2 is overlapped with an area in which the first hole H1 is formed at the gate insulation layer 130. Moreover, a size of the second hole H2 may be substantially greater than that of the first hole H1. Thus, a side surface portion of the first gate pad electrode 163 may be a step shape.

Figure 9:
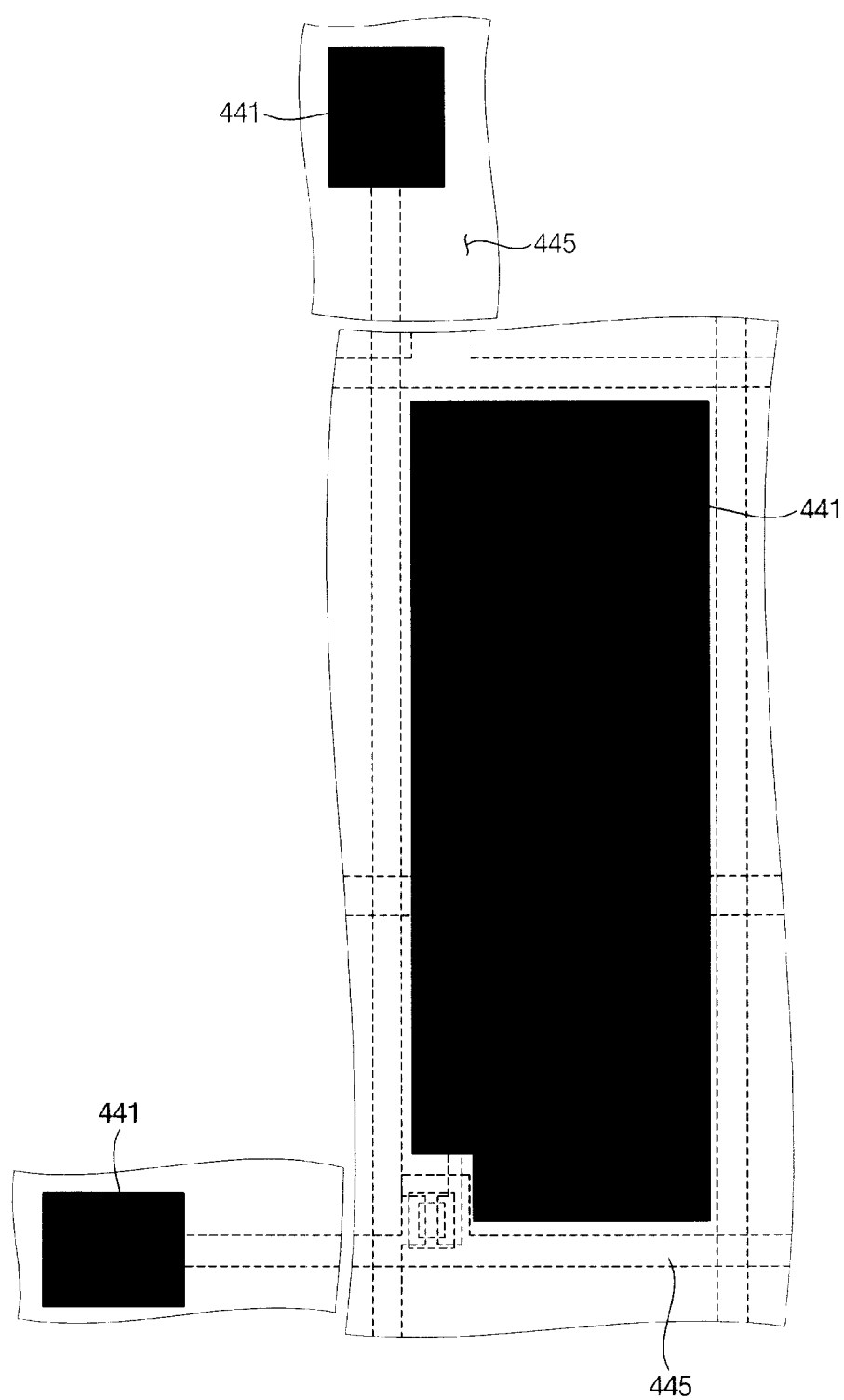
FIG. 9 is a plan view showing a fourth mask for manufacturing the display substrate of FIG. 1.
Figure 10:
FIG. 10 is a cross-sectional view explaining a method of manufacturing the display substrate of FIG. 1 by using the fourth mask of FIG. 9.
Figure 10:
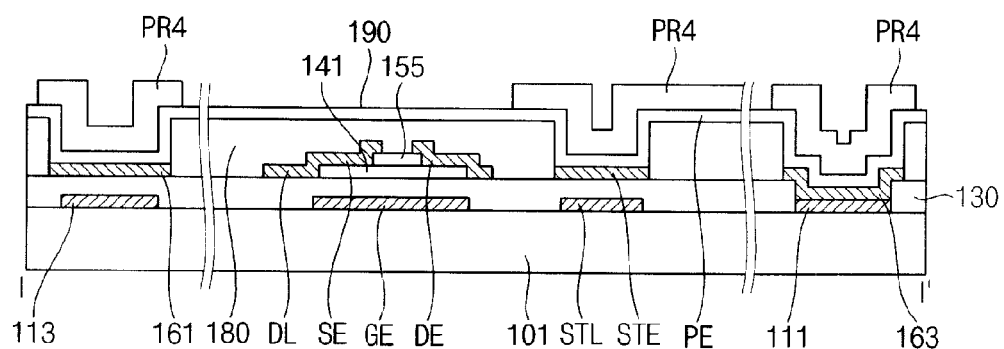

FIG. 9 is a plan view showing a fourth mask for manufacturing the display substrate of FIG. 1. FIG. 10 is a cross-sectional view explaining a method of manufacturing the display substrate of FIG. 1 by using the fourth mask of FIG. 9.

Referring to FIG. 1 and FIG. 9, the fourth mask 440 is a mask for patterning a positive photoresist. The fourth mask 440 includes a light-blocking portion 441 and a light-transmitting portion 445. The light-blocking portion 441 is an area in which light is blocked, and the light-transmitting portion 445 is an area in which light is transmitted. The light-blocking portion 441 is disposed on an area on which the pixel electrode PE, the second gate pad electrode 193 and the data pad electrode 195 are formed.

Referring to FIG. 9 and FIG. 10, a transparent conductive layer 190 is formed on the substrate 101 having the second hole H2, the third hole H3 and the fourth hole H4 formed therethrough. The transparent conductive layer 190 may be formed by an indium tin oxide (ITO) or an indium zinc oxide (IZO). The transparent conductive layer 190 may be formed through a sputtering process or a coating process.

A positive photoresist material is deposited on the substrate 101 in which the transparent conductive layer 190 is formed to form a fourth photoresist layer. The fourth photoresist layer is patterned by using the fourth mask 440. In the fourth photoresist layer, a seventh photo pattern PR4 is formed by using the light-blocking portion 441. The seventh photo pattern PR4 is disposed on an area on which a transparent electrode pattern is formed. For example, the seventh photo pattern PR4 is disposed on an area on which the pixel electrode PE, the second gate pad electrode 193 and the data pad electrode 195 are formed.

The transparent electrode layer 190 is patterned by using the seventh photo pattern PR4 to form the pixel electrode PE, the second gate pad electrode 193 and the data pad electrode 195. Then, the seventh photo pattern PR4 is removed.

According to the present exemplary embodiment, the display substrate 100, which includes the semiconductor pattern 141 formed from an oxide semiconductor material and the etching prevention pattern 155 for preventing an etching of the semiconductor pattern 141, may be manufactured by using a four-masking process. Moreover, although the four-masking process is used thereto, the semiconductor pattern 141 is not disposed between the data line DL and the gate insulation layer 130, so that display defects such as a waterfall may be prevented.

Hereinafter, the same reference numerals will be used to refer to the same or like parts as those described in the above and any further explanation concerning the above elements will be omitted.

Figure 11:
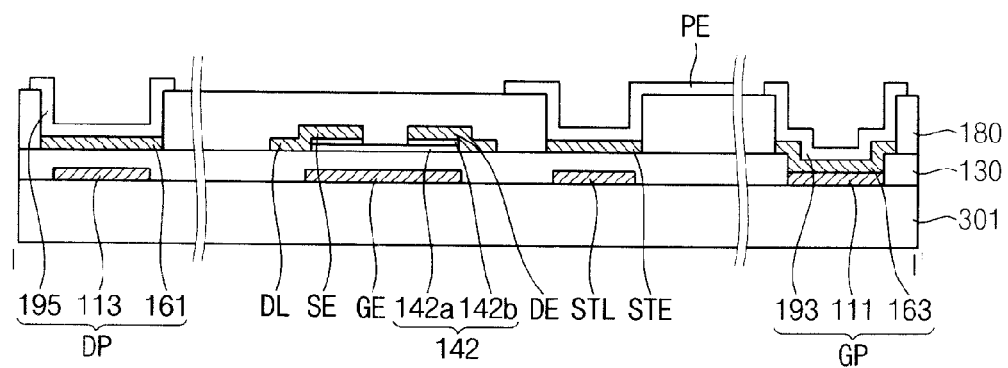
FIG. 11 is a cross-sectional view showing a display substrate according to another exemplary embodiment of the present invention.

FIG. 11 is a cross-sectional view showing a display substrate according to another exemplary embodiment of the present invention. A plan view of the display substrate 300 according to the present exemplary embodiment is substantially the same as the plan view of the display substrate 100 shown in FIG. 1.

Referring to FIG. 1 and FIG. 11, the display substrate 300 includes a substrate 301, a gate line GL, a gate pad portion GP, a data line DL, a data pad portion DP, a switching element TR, a storage line STL and a pixel electrode PE. In this exemplary embodiment, the gate line GL, the gate pad portion GP, the data line DL, the data pad portion DP, the switching element TR and the pixel electrode PE may be substantially the same as components described with reference to FIG. 2, and thus any repetitive detailed explanation may be hereinafter be omitted.

The switching element TR is electrically connected to the gate line GL, the data line DL and the pixel electrode PE to include a gate electrode GE, a semiconductor pattern 142, a source electrode SE and a drain electrode DE. The gate electrode GE is connected to the gate line GL, and the source electrode SE is overlapped with a first end portion of the semiconductor pattern 142. The drain electrode DE is overlapped with a second end portion of the semiconductor pattern 142 to be spaced apart from the source electrode SE.

The semiconductor pattern 142 includes a semiconductor layer 142a having amorphous silicon (a-Si:H) and an ohmic contact layer 142b having n+ amorphous silicon (n+a-Si:H) that is heavily doped with an n-type impurity.

According to the present exemplary embodiment, the data line DL and the gate insulation layer 130 are disposed to make contact directly with each other. Thus, a semiconductor pattern is not disposed between the data line DL and the gate insulation layer 130, so that display defects such as a waterfall may be prevented.

FIG. 12A, FIG. 12B, FIG. 12C, FIG. 12D, FIG. 12E, FIG. 12F and FIG. 12G are cross-sectional views explaining a method of manufacturing the display substrate of FIG. 11.

Figure 12A:
FIG. 12A, FIG. 12B, FIG. 12C, FIG. 12D, FIG. 12E, FIG. 12F and FIG. 12G are cross-sectional views explaining a method of manufacturing the display substrate of FIG. 11.
Figure 12A:
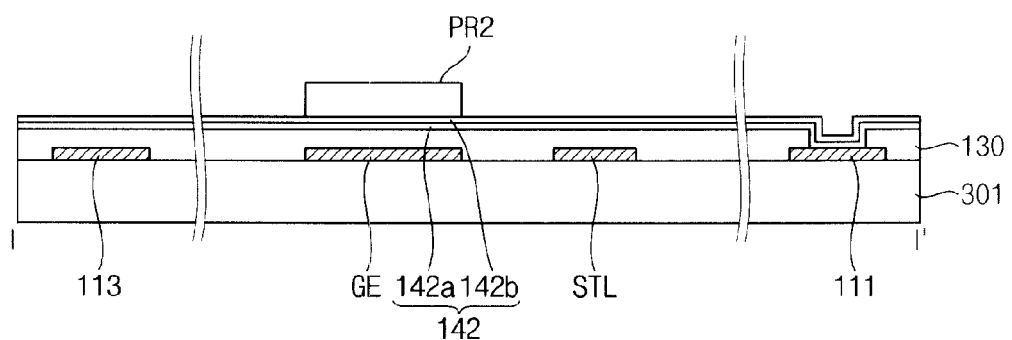

Referring to FIG. 1 and FIG. 12A, a gate metal pattern, which includes the gate line GL, the gate electrode GE and the storage line STL, is formed on a substrate 301. Then, a gate insulation layer 130 having a first hole H1 formed therethrough is formed on the substrate 301 in which the gate metal pattern is formed. The first hole H1 exposes an end portion 111 of the gate line GL. The gate metal pattern and the gate insulation layer 130 may be formed by a process identical to the process described above with reference to FIG. 3, FIG. 4A, FIG. 4B, FIG. 4C, FIG. 4D and FIG. 4E.

A semiconductor layer 142a and an ohmic contact layer 142b are formed on the gate insulation layer 130 through which the first hole H1 is formed. The semiconductor layer 142a has amorphous silicon (a-Si:H), and the ohmic contact layer 142b has n+ amorphous silicon (n+a-Si:H) that is heavily doped with an n-type impurity.

A second photoresist layer is formed on the substrate 301 on which the semiconductor layer 142a and the ohmic contact layer 142b are formed. The second photoresist layer is patterned by using a second mask 520 to form a third photo pattern PR2.

The second mask 520 includes a light-blocking portion 521 blocking light and a light-transmitting portion 525 transmitting light. The light-blocking portion 521 is disposed on an area where the semiconductor pattern 142 is formed, that is the gate electrode GE, and the light-transmitting portion 525 is disposed on an area where the semiconductor pattern 142 is not formed.

Figure 12B:
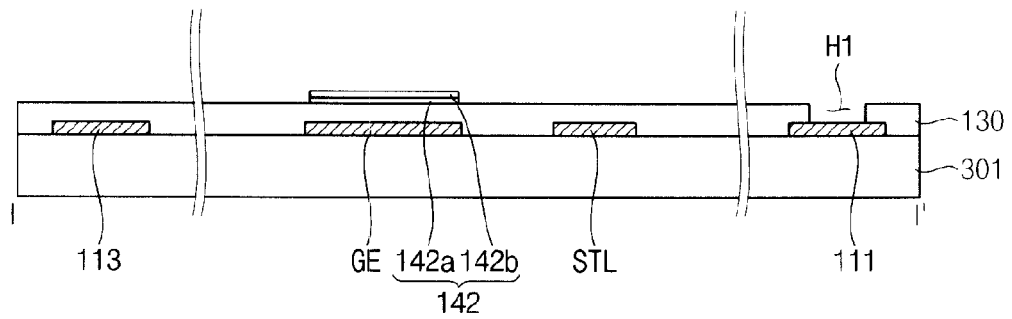

Referring to FIG. 1 and FIG. 12B, the semiconductor layer 142a and the ohmic contact layer 142b are patterned by using the third photo pattern PR2 to form the semiconductor pattern 142 on the gate electrode GE. Then, the third photo pattern PR2 is removed.

Figure 12C:
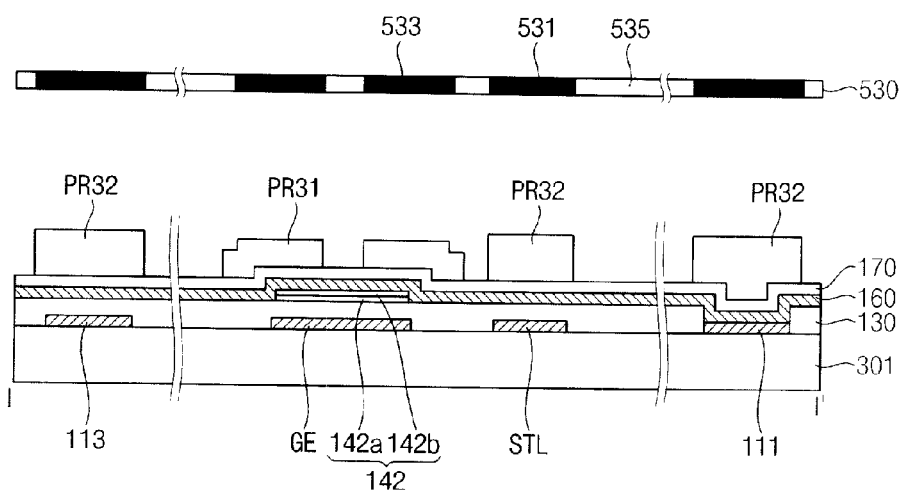

Referring to FIG. 1, FIG. 12B and FIG. 12C, a source metal layer 160 and a second sacrificial metal layer 170 are formed on the substrate 301 on which the semiconductor pattern 142 is formed.

Then, a third photoresist layer is formed on the second sacrificial metal layer 170. In the third photoresist layer, a fifth photo pattern PR31 and a sixth photo pattern PR32 that is thicker than the fifth photo pattern PR31 are formed by using a third mask 530.

The third mask 530 includes a light-blocking portion 531 blocking light, a slit portion 533 diffracting light, and a light-transmitting portion 535 transmitting light. The light-blocking portion 531 is disposed in correspondence with an end portion 113 of the data line DL, a portion of the storage electrode STE and the first gate pad electrode 163. The slit portion 533 is formed in correspondence with the data line DL, the source electrode SE and the drain electrode DE.

The sixth photo pattern PR32 is disposed on an end portion 113 of the data line DL, a portion area of the storage electrode STE and an area where the first gate pad electrode 163 is formed, by the light-blocking portion 531. The fifth photo pattern PR31 is disposed on an area where the data line DL, the source electrode SE and the drain electrode DE are formed, by the slit portion 533. That is, the light-blocking portion 531 is disposed on an area where a second hole H2 which exposes the first gate pad electrode 163, a third hole H3 which exposes an end portion 161 of the data line DL and a fourth hole H4 which exposes a portion area of the storage electrode STE are formed.

Figure 12D:
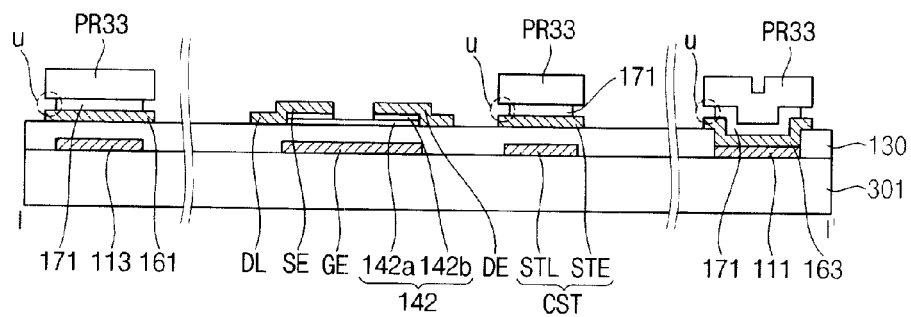

Referring to FIG. 1, FIG. 12C and FIG. 12D, the source metal layer 160 and the second sacrificial metal layer 170 are patterned by using the fifth photo pattern PR31 and the sixth photo pattern PR32 to form a second metal pattern M2. The second metal pattern M2 includes a source metal pattern and a second sacrificial metal pattern 171. The source metal pattern includes the data line DL, the storage electrode STE, the first gate pad electrode 163, the source electrode SE and the drain electrode DE. The second sacrificial metal pattern 171 is formed on the source metal pattern.

The fifth photo pattern PR31 formed on the second metal pattern M2 is removed by using an etch back process and the sixth photo pattern PR32 formed on the second metal pattern M2 is partially removed by using the etch back process, so that a third remaining pattern PR33 is formed.

Accordingly, the third remaining pattern PR33 is disposed on the end portion 161 of the data line DL, a portion area of the storage electrode STE and the first gate pad electrode 163, and the second sacrificial metal pattern 171 on the data line DL, the source electrode SE and the drain electrode DE is exposed.

The second sacrificial metal pattern 171 disposed on the data line DL, the source electrode SE and the drain electrode DE is removed using the third remaining pattern PR33 as a mask. Then, the ohmic contact layer 142b of the semiconductor pattern 421 exposed by the source electrode SE and the drain electrode DE is removed to form a channel of the switching element TR. For example, an etching process of the ohmic contact layer 142b may be a dry etching process.

Moreover, after the etch back process, the ohmic contact layer 142b corresponding to a channel area of the switching element TR may be removed to form a channel of the switching element TR, and then the second sacrificial metal pattern 171 formed on the data line DL, the source electrode SE and the drain electrode DE may be removed.

Due to a process of removing the second sacrificial metal pattern 171 formed on the data line DL, the source electrode SE and the drain electrode DE, an undercut U is formed on the second sacrificial metal pattern 171 formed on the end portion 161 of the data line DL, a portion area of the storage electrode STE and the first gate pad electrode 163.

Figure 12E:
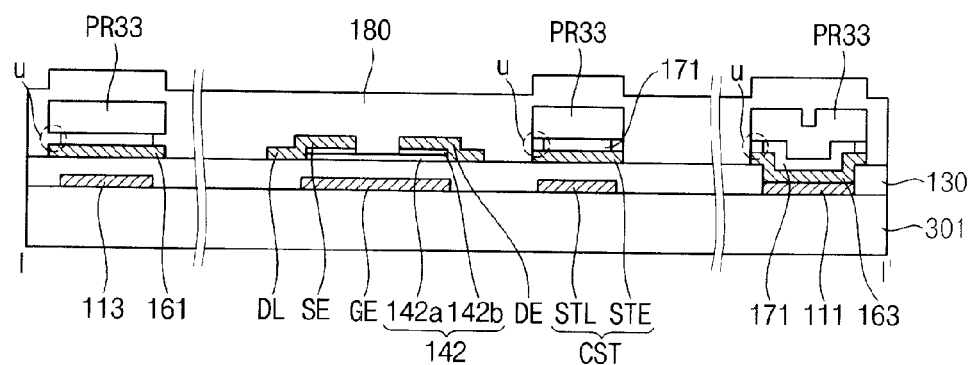

Referring to FIG. 1, FIG. 12D and FIG. 12E, the protection insulation layer 180 is formed on the substrate 301 on which the undercut U is formed. The protection insulation layer 180 covers the source metal pattern including the data line DL, the source electrode SE, the drain electrode DE and the storage electrode STE, and covers the third remaining pattern PR33.

Figure 12F:
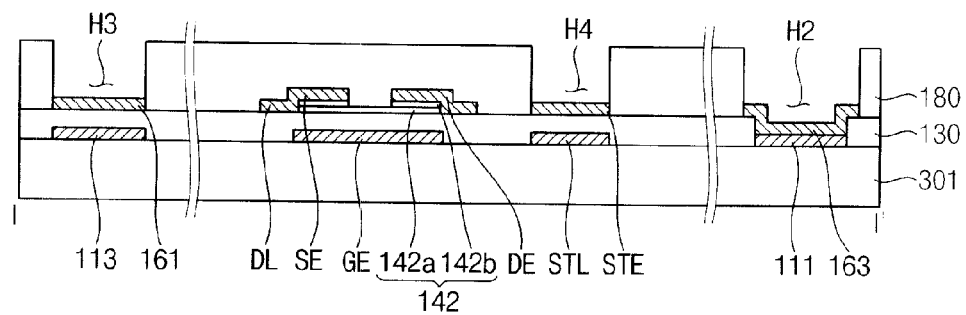

Referring to FIG. 1, FIG. 12E and FIG. 12F, in the substrate 301 on which the protection insulation layer 180 is formed, the second sacrificial metal pattern 171 formed on an end portion 161 of the data line DL, the first gate pad electrode 163 and a portion area of the storage electrode STE is removed by using an etching solution. The etching solution is infiltrated into a gap of the protection insulation layer 180 which is formed by the undercut U, so that the second sacrificial metal pattern 171 formed on an end portion 161 of the data line DL, the first gate pad electrode 163 and a portion area of the storage electrode STE is etched. Thus, the second sacrificial metal pattern 171 is removed, and the third remaining pattern PR33 formed on the second sacrificial metal pattern 171 is removed simultaneously with the removal of the second sacrificial metal pattern 171.

As a result, the second hole H2 exposing the first gate pad electrode 163, the third hole H3 exposing the end portion 161 of the data line DL and the fourth hole H4 exposing a portion area of the storage electrode STE are formed through the protection insulation layer 180.

Figure 12G:
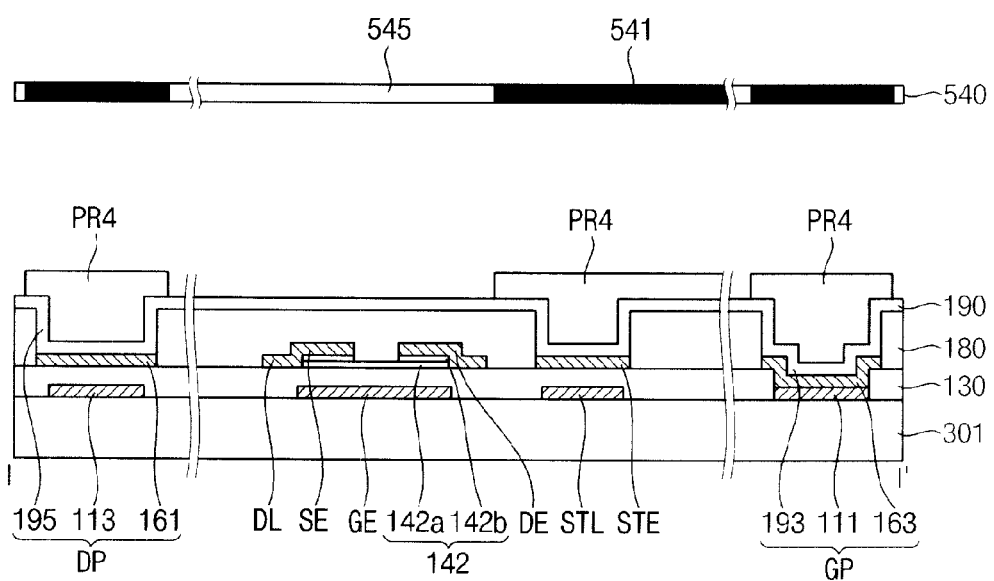

Referring to FIG. 1, FIG. 12F and FIG. 12G, a transparent conductive layer 190 is formed on the substrate 301 through which the second hole H2, the third hole H3 and the fourth hole H4 are formed.

A fourth photoresist layer is formed on the substrate 301 on which the transparent conductive layer 190 is formed. The fourth photoresist layer is patterned by using a fourth mask 540. In the fourth photoresist layer, a seventh photo pattern PR4 is formed by using a light-blocking portion 541. The seventh photo pattern PR4 is disposed on an area on which a transparent electrode pattern is formed. For example, the seventh photo pattern PR4 is disposed on an area on which the pixel electrode PE, the second gate pad electrode 193 and the data pad electrode 195 are formed.

The transparent electrode layer 190 is patterned by using the seventh photo pattern PR4 as a mask to form the pixel electrode PE, the second gate pad electrode 193 and the data pad electrode 195. Then, the seventh photo pattern PR4 is removed.

According to the present exemplary embodiment, the display substrate 300 may be manufactured by using a four-masking process. Moreover, although the four-masking process is used thereto, a semiconductor pattern is not disposed between the data line DL and the gate insulation layer 130, so that display defects such as a waterfall may be prevented. Accordingly, the number of masks in manufacturing the display substrate may be decreased.

The foregoing is illustrative of the present invention and is not to be construed as limiting thereof. Although a few exemplary embodiments of the present invention have been described, those skilled in the art will readily appreciate that many modifications are possible in the exemplary embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific exemplary embodiments disclosed, and that modifications to the disclosed exemplary embodiments, as well as other exemplary embodiments, are intended to be included within the scope of the appended claims and their equivalents. The present invention is defined by the following claims, with equivalents of the claims to be included therein.

What is claimed is:

1. A method of manufacturing a display substrate, the method comprising:
    forming a gate metal pattern comprising a gate line and a gate electrode and a sacrificial metal pattern formed on the gate metal pattern by patterning a gate metal layer and a first sacrificial metal layer formed on a substrate;
    forming a gate insulation layer comprising a first hole exposing an end portion of the gate line, the first hole being formed by using the first sacrificial metal pattern formed on the end portion of the gate line;
    forming a semiconductor pattern on a portion of the gate insulation layer corresponding to an area where the gate electrode is formed;
    forming a data metal pattern on the semiconductor pattern, the data metal pattern comprising a source electrode connected to a data line, a drain electrode spaced apart from the source electrode, and a first gate pad electrode that contacts the end portion of the gate line through the first hole;
    forming a protection insulation layer comprising a second hole and a third hole, the second hole exposing the first gate pad electrode and the third hole exposing an end portion of the data line; and
    forming a second gate pad electrode that contacts the first gate pad electrode through the second hole, a data pad electrode that contacts the end portion of the data line through the third hole, and a pixel electrode electrically connected to the drain electrode.

2. The method of claim 1, wherein forming the sacrificial metal pattern comprises:
    forming a first photo pattern and a second photo pattern that is thicker than the first photo pattern on the substrate comprising the gate metal layer and the first sacrificial metal layer; and
    forming the gate metal pattern comprising the gate line, the gate electrode and a storage line in parallel with the gate line, and the first sacrificial metal pattern by using the first photo pattern and the second photo pattern.

3. The method of claim 2, wherein forming the gate insulation layer comprises:
    removing the first photo pattern and the second photo pattern by a thickness to expose the first sacrificial metal pattern on the gate line, the gate electrode and the storage line and to form a first remaining pattern on the end portion of the gate line;
    etching the first sacrificial metal pattern by using the first remaining pattern to form an under cut on the first sacrificial metal pattern formed below the first remaining pattern;
    forming the gate insulation layer on the substrate comprising the under cut; and
    removing the sacrificial metal pattern formed on the end portion of the gate line in which the under cut is formed to form the first hole.

4. The method of claim 3, wherein forming the semiconductor pattern comprises:
    forming an oxide semiconductor layer and an insulation layer on the gate insulation layer;
    forming a third photo pattern and a fourth photo pattern thicker than the third photo pattern on the insulation layer;
    sequentially forming a semiconductor pattern and an insulation pattern on the semiconductor pattern in correspondence with an area in which the gate electrode is formed by using the third photo pattern and the fourth photo pattern;
    forming a second remaining pattern on the insulation pattern by removing the third photo pattern and the fourth photo pattern by a thickness; and
    forming an etching prevention pattern by etching the insulation pattern by using the second remaining pattern.

5. The method of claim 4, wherein forming the data metal pattern comprises:
    forming a source metal layer and a second sacrificial metal layer on the substrate comprising the etching prevention pattern;
    forming a fifth photo pattern and a sixth photo pattern thicker than the fifth photo pattern on the substrate comprising the source metal layer and the second sacrificial metal layer; and
    forming a source metal pattern and a second sacrificial metal pattern on the source metal pattern by using the fifth photo pattern and the sixth photo pattern, the source metal pattern comprising the source electrode that is connected to the data line, the drain electrode, the first gate pad electrode, and a storage electrode connected to the drain electrode and overlapped with the storage line.

6. The method of claim 5, wherein forming the protection insulation layer comprises:
    removing the fifth photo pattern and the sixth photo pattern in a thickness to expose the second sacrificial metal pattern on the data line, the source electrode and the drain electrode and forming a third remaining pattern on the end portion of the data line, the first gate pad electrode and the storage electrode;
    etching the second sacrificial metal pattern by using the third remaining pattern to form an under cut on the second sacrificial metal pattern formed below the third remaining pattern;
    forming the protection insulation layer on the substrate comprising the under cut; and
    forming the second hole exposing the first gate pad electrode, the third hole exposing the end portion of the data line and a fourth hole exposing the storage electrode by using the under cut.

7. The method of claim 6, wherein the pixel electrode contacts the storage electrode through the fourth hole.

8. The method of claim 3, wherein forming the semiconductor pattern comprises:
    forming a semiconductor layer and an ohmic contact layer on the gate insulation layer;
    forming a third photo pattern on the ohmic contact layer; and
    forming the semiconductor pattern on an area where the gate electrode is formed by using the third photo pattern.

9. The method of claim 8, wherein forming the data metal pattern comprises:
    forming a source metal layer and a second sacrificial metal layer on the substrate comprising the semiconductor pattern;

forming a fifth photo pattern and a sixth photo pattern that is thicker than the fifth photo pattern on the substrate comprising the source metal layer and the second sacrificial metal layer; and forming a source metal pattern and a second sacrificial metal pattern on the source metal pattern by using the fifth photo pattern and the sixth photo pattern, the source metal pattern comprising the source electrode that is connected to the data line, the drain electrode, the first gate pad electrode, and a storage electrode connected to the drain electrode and overlapped with the storage line.

10. The method of claim 9, wherein forming the protection insulation layer comprises:

removing the fifth photo pattern and the sixth photo pattern by a thickness to expose the second sacrificial metal pattern on the data line, the source electrode and the drain electrode and forming a third remaining pattern on the end portion of the data line, the first gate pad electrode and the storage electrode;

removing the ohmic contact layer exposed at an interval area between the source electrode and the drain electrode;

etching the second sacrificial metal pattern by using the third remaining pattern to form an under cut on the second sacrificial metal pattern formed below the third remaining pattern;

forming the protection insulation layer on the substrate comprising the under cut; and forming the second hole exposing the first gate pad electrode, the third hole exposing the end portion of the data line and a fourth hole exposing the storage electrode by using the under cut.

11. The method of claim 10, wherein the pixel electrode contacts the storage electrode through the fourth hole.

* * * * *